United States Patent
Sridhara

(10) Patent No.: US 9,997,255 B2
(45) Date of Patent: Jun. 12, 2018

(54) TESTING RETENTION MODE OF AN SRAM ARRAY

(75) Inventor: Srinivasa Raghavan Sridhara, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 229 days.

(21) Appl. No.: 13/567,227

(22) Filed: Aug. 6, 2012

(65) Prior Publication Data

US 2014/0036609 A1    Feb. 6, 2014

(51) Int. Cl.
G11C 7/00      (2006.01)
G11C 29/00     (2006.01)
G11C 29/50     (2006.01)
G11C 11/41     (2006.01)

(52) U.S. Cl.
CPC ........ G11C 29/00 (2013.01); G11C 29/50016 (2013.01); *G11C 11/41* (2013.01)

(58) Field of Classification Search
CPC ......... G11C 29/04; G11C 29/02; G11C 29/08; G11C 2029/5602; G11C 29/10; G11C 29/52; G11C 16/34; G11C 2029/1208

USPC ........ 365/201, 189.07, 189.011, 226, 233.1, 365/154

See application file for complete search history.

(56) References Cited

U.S. PATENT DOCUMENTS

| | | | |
|---|---|---|---|
| 6,256,241 B1 * | 7/2001 | Mehalel | 365/201 |
| 6,665,227 B2 * | 12/2003 | Fetzer | 365/229 |
| 7,324,391 B2 * | 1/2008 | Loh et al. | 365/201 |
| 2005/0185473 A1 * | 8/2005 | Schubert | 365/189.01 |
| 2008/0316837 A1 * | 12/2008 | Nii | 365/189.07 |

* cited by examiner

*Primary Examiner* — Mohammed A Bashar
(74) *Attorney, Agent, or Firm* — Kenneth Liu; Charles A. Brill; Frank D. Cimino

(57) ABSTRACT

An embodiment of the invention discloses a method for testing the retention mode of an array of SRAM cells. A data pattern is written to the array. After the data pattern is written, a retention circuit is enabled for a period of time that drops the voltage on a supply line. During this period of time, a first current is drawn from the supply line by sources internal (i.e. leakage current) to the array. Also during this time period, current is drawn from the supply line by a discharge circuit. The second current is provided to shorten the time required to test the retention mode of the array. After the period of time has expired, the retention mode and the discharge circuit are disabled and the data pattern is read from the array and compared to the data pattern written to the array.

12 Claims, 6 Drawing Sheets

TESTING RETENTION MODE OF AN SRAM ARRAY

BACKGROUND

This invention relates to integrated circuits, particularly to static random access memory (SRAM) devices, in either embedded form or stand alone (i.e. discrete) form.

As integrated circuits (ICs) become physically larger and more complex, the amount of power used by an IC increases. Power consumption in an IC may increase for several reasons. For example, the frequency at which an IC switches consumes power by charging and discharging capacitance on the IC. Increasing the switching frequency increases the power consumed on an IC. Power may also be consumed due to DC (direct current) conditions such as leakage in transistors and voltage dropped across resistors.

Power reduction may be achieved by reducing power supply voltages provided to the IC. For example, the voltage applied to an SRAM (Static Random Access Memory) may be reduced when the SRAM is not being accessed. Power reduction is particularly important in the design of DSP (Digital Signal Processor) ICs with large memory arrays. The power used by large memory arrays may be reduced by putting them into a "sleep" mode or a "retain" mode where the voltage applied to the array is reduced. However, some of the data in some ICs may be lost during retention due to process non-idealities such as defects and parametric variations.

To prevent data for an end user from being lost while in the retain mode, it is important to be able to test SRAM arrays, while in the retain mode, before being deployed to the end user. It is also important that the time taken to test SRAM arrays while in the retain mode be relatively short.

DETAILED DESCRIPTION

The drawings and description, in general, disclose a method and circuits for testing the retention mode of an array of SRAM cells. In an embodiment of the invention, a data pattern is written to the array of SRAM cells so that each SRAM cell in the array of SRAM cells has a known value. After the data pattern is written to the array of SRAM cells, a retention mode is enabled for a period of time that drops the voltage on a supply line. During this period, a first current is drawn from the supply line by sources internal (i.e. leakage current) to the array of SRAM cells. Also during this time period, current is drawn from the supply line by a second current. The second current is provided by a discharge circuit. The discharge circuit is not part of the array of SRAM cells. The second current is provided to shorten the time required to test the retention mode of the array of SRAM cells.

After the period of time has expired, the retention mode and the discharge circuit are disabled. When the retention mode and the discharge circuit have been disabled, the data pattern is read from the array of SRAM cells and compared to the data pattern written to the array of SRAM cells. If the data pattern written to the array of SRAM cells matches the data pattern read from the array of SRAM cells, the array of SRAM cells has passed the retention mode test and can be safely used in retention mode. If the data pattern written to the array of SRAM cells does not match the data pattern read from the array of SRAM cells, the array of SRAM cells has failed the retention mode test and cannot safely operate in the retention mode.

Figure 1:
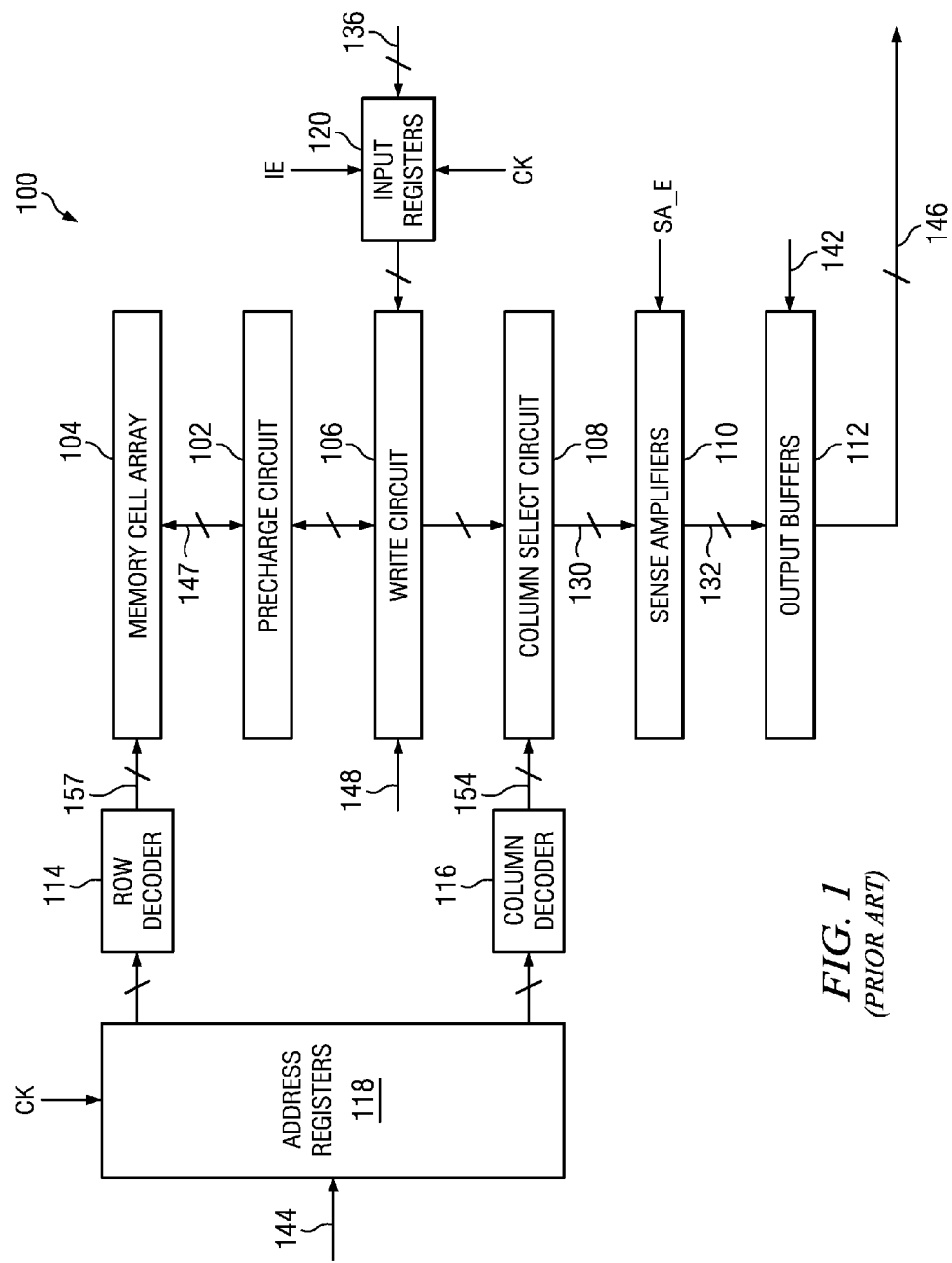
FIG. 1 is a block diagram of an SRAM (Static Random Access Memory). (Prior Art)

FIG. 1 is a block diagram of an SRAM (Static Random Access Memory) 100 (Prior Art). In this embodiment only a single array of SRAM cells 104 is shown for illustrative purposes. Typically, an SRAM has more than one array of SRAM cells. In this example, a pre-charge circuit 102 pre-charges the bit lines 147 in the memory cell array 104 to a predetermined voltage before the memory cell array 104 is either read from or written to.

When the memory cell array 104 is read from, an address 144 is input to the address registers 118. The address 144 stored in the address registers 118 is then clocked by a clock signal CK from the address registers to a row decoder 114 and a column decoder 116. In this example, the row decoder 114 drives a word line selected from the word lines 157 in the memory cell array 104 to a logical high value. Memory cells attached to the selected word line provide data that is passed through the pre-charge circuit 102 and the write circuit 106 to the column select circuit 108. The column select circuit 108 selects what data 130 is provided to the sense amplifiers 110 based on the output 154 of the column decoder 116. The sense amplifiers 110 increase the voltage of the selected data 130 when the sense amplifiers are enabled by signal SA_E. The amplified signals 132 are sent to the output buffers 112. The output buffers 112 retain the amplified signals 132. When the output enable signal 142 is active, the output buffers 112 send the stored data 146 in the output buffers 112 from the SRAM 100 to other circuits.

When the memory cell array 104 is written to, an address 144 is input to the address registers 118 and the write enable signal 148 is activated. The address 144 stored in the address registers 118 is then clocked by a clock signal CK from the address registers to a row decoder 114 and a column decoder 116. In this example, the row decoder 114 drives a word line selected from the word lines 157 in the memory cell array 104 to a logical high value. The selected word line along with the selected bit lines determine which memory cells in the memory cell array 104 will be written to. The input enable signal IE allows data 136 previously stored in the input registers 120 to be written into the memory cell array 104.

Figure 2:
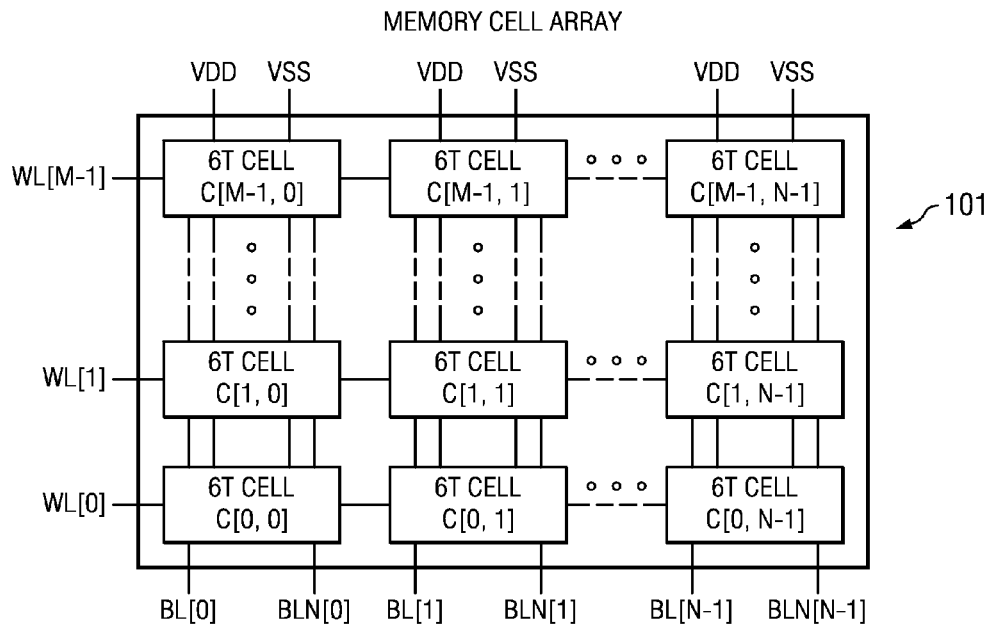
FIG. 2 is a block diagram of an array of SRAM cells with six-transistor memory cells. (Prior Art)

FIG. 2 is a block diagram of an array of SRAM cells 101 with six-transistor memory cells, C[0,0]-C[M-1,N-1]. In this example, power and ground are provided to the 6 transistor memory cells C[0,0]-C[M-1,N-1] by voltage supplies VDD and VSS. Data is written to and read from the memory cell array 101 using word lines WL[0]-WL[M-1] and bit lines BL[0]-BL[N-1] and BLN[0]-BLN[N-1].

Figure 3:
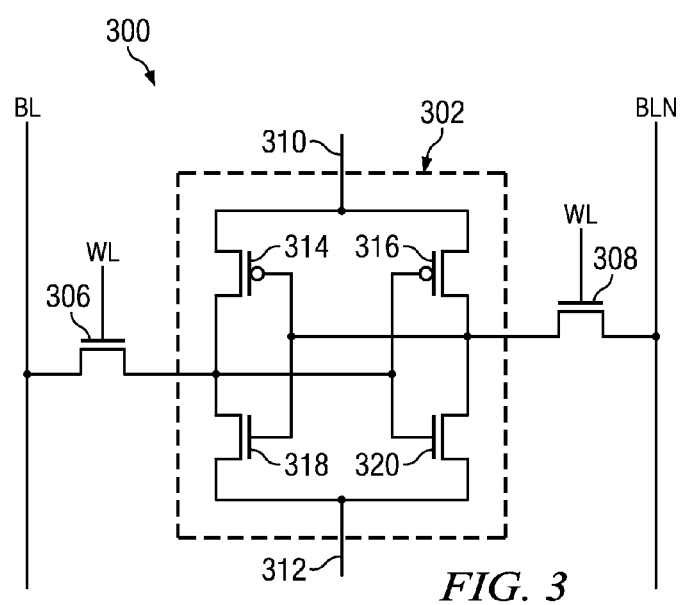
FIG. 3 is a schematic diagram of a six-transistor SRAM cell. (Prior Art)

The six-transistor SRAM cell shown in FIG. 3 includes a latch 302 and two transfer transistors 306 and 308. The latch 302 is connected between the latch sourcing supply line 310 and the latch sinking supply line 312. The latch 302 includes two PMOS (p-type channel metal-oxide semiconductor) transistors 314 and 316 and two NMOS (n-type channel metal-oxide semiconductor) transistors 318 and 320. The gates of transistors 314 and 318 are electrically connected to the drains of transistors 316, 320 and 308. The sources of the two PMOS transistors 314 and 316 are electrically connected to the latch sourcing supply line 310. The sources of the two NMOS transistors 314 and 316 are electrically connected to the latch sinking supply line 312. The gates of transistors 316 and 320 are electrically connected to the drains of transistors 306, 314 and 318. The word line WL is connected to the gates of the two transfer transistors 306 and 308. The source of transfer transistor 306 is connected to bit line BL and the source of transfer transistor 308 is connected to bit line BLN.

Figure 4:
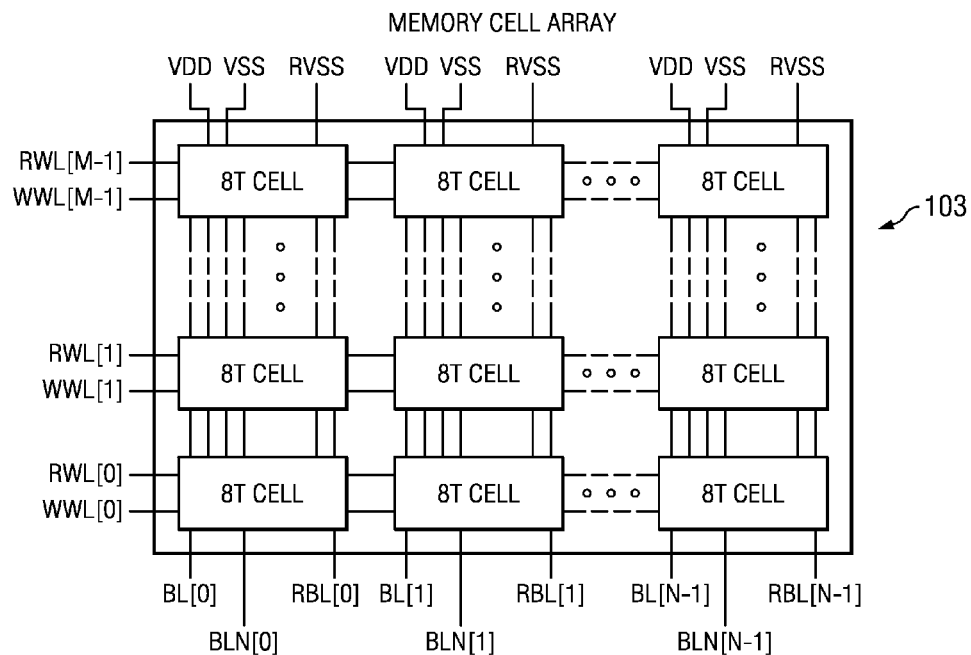
FIG. 4 is a block diagram of an array of SRAM cells with eight-transistor memory cells. (Prior Art)

FIG. 4 is a block diagram of a memory cell array 103 with eight-transistor memory cells, C[0,0]-C[M-1,N-1]. In this example, power and ground are provided to the eight transistor memory cells C[0,0]-C[M-1,N-1] by voltage supplies VDD, VSS and RVSS. Data is written to the memory cell array 101 using write word lines WWL[0]-WWL[M-1] and write bit lines BL[0]-BL[N-1] and BLN[0]-BLN[N-1]. Data is read from the memory cell array 101 using read word lines RWL[0]-RWL[M-1] and read bit lines RBL[0]-RBL[N-1].

Figure 5:
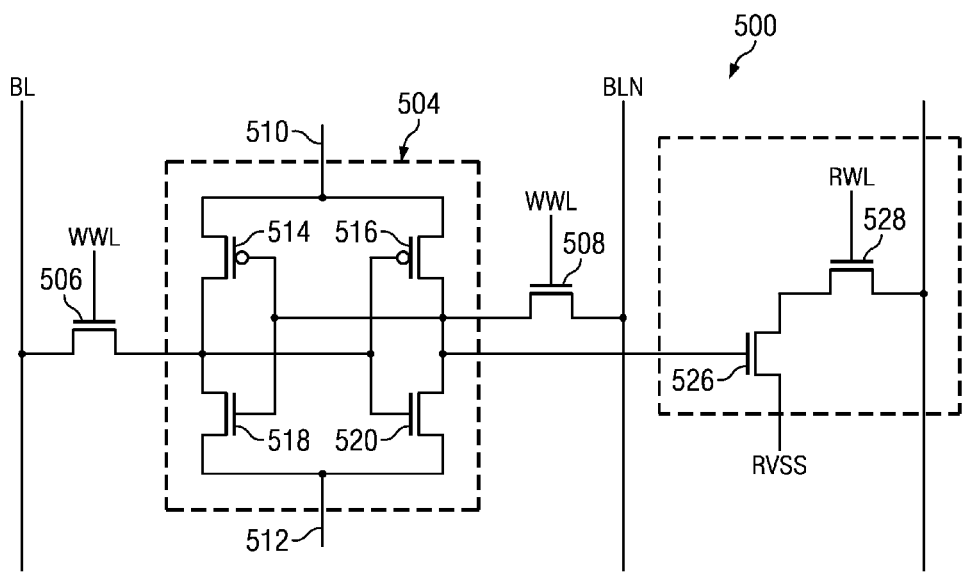
FIG. 5 is a schematic diagram of an eight-transistor SRAM cell. (Prior Art)

The eight-transistor SRAM cell shown in FIG. 5 includes a latch 504 connected between latch sourcing supply line 510 and latch sinking supply line 512, two NMOS (n-channel metal-oxide semiconductor) transistors 506 and 508 and a read buffer 502. The latch 504 includes two PMOS (p-channel metal-oxide semiconductor) transistors 514 and 516 and two NMOS transistors 518 and 520. The gates of transistors 514 and 518 are electrically connected to the drains of transistors 516, 520 and 508. The sources of the two PMOS transistors 514 and 516 are electrically connected to the latch sourcing supply line 510. The sources of the two NMOS transistors 514 and 516 are electrically connected to the latch sinking supply line 512. The gates of transistors 516 and 520 are electrically connected to the drains of transistors 506, 514 and 518. The write word line WWL is electrically connected to the gates of transistors 506 and 508. The source of transistor 506 is electrically connected to the write bit line BL and the source of transistor 508 is electrically connected to the write bit line BLN The read buffer 502 includes two NMOS transistors 526 and 528. The gate of transistor 526 is electrically connected to the drain of transistor 508 while the gate of transistor 528 is electrically connected to the read word line RWL. The source of transistor 528 is electrically connected to the read bit line RBL while the source of transistor 526 is connected to the read sinking voltage supply RVSS. The drains of transistors 526 and 528 are electrically connected.

The operation of six-transistor and eight-transistor memory cells has been explained to illustrate the function of an SRAM. However, embodiments of this invention apply to any array of SRAM cells.

Figure 6:
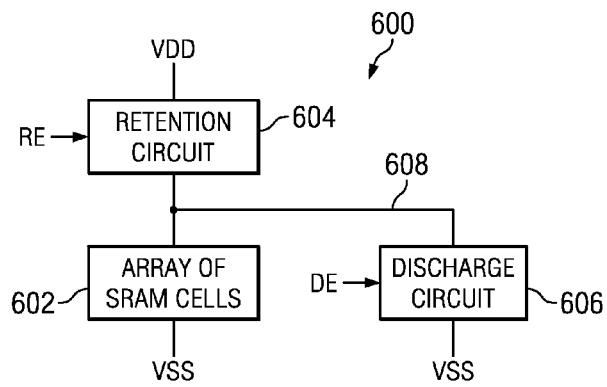
FIG. 6 is a block diagram of an array of SRAM cells, a retention circuit and a discharge circuit according to an embodiment of the invention.

FIG. 6 is a block diagram of an array of SRAM cells 602, a retention circuit 604 and a discharge circuit 606 according to an embodiment of the invention. In this embodiment of the invention, the voltage applied to the supply line 608 may be varied based on whether the array of SRAM cells 602 is in the retention mode or not. When the array of SRAM cells 602 is in the retention mode, the voltage applied to the supply line 608 is approximately equal to VDD minus a threshold voltage $V_t$. Lowering the voltage applied to the supply line 608 reduces the power drawn by the array of SRAM cells 602. When the array of SRAM cells 602 is not in the retention mode, the voltage applied to the sourcing supply line 608 is approximately equal to VDD.

The data stored in the array of SRAM cells 602 is expected to be correctly retained when ICs are manufactured under ideal conditions. However, process non-idealities such as defects and parametric variations cause data in some of the cells in the array of SRAM cells 602 to be lost. Therefore, it is important to test the array of SRAM cells 602 to ensure that retention can be safely enabled. One method of testing the retention mode is to write a data pattern into the array of SRAM cells 602. After the data pattern is written into the array of SRAM cells 602, the array of SRAM cells 602 is put into the retention mode for a period of time. After this period of time has elapsed, the data pattern is read from the array of SRAM cells and compared to the data pattern written to the array of SRAM cells 602. When the data patterns match (i.e. no bit in the array has changed its logical value), retention mode testing is completed successfully. When the data patterns do not match (i.e. one or more bits in the array have changed logical values), the retention mode tested has failed and the SRAM cannot be safely used in retention mode.

The amount of time required to test the retention mode of an array of SRAM cells 602 increases as the leakage of cells decreases. The test time is dependent on the internal leakage of the cells in the array 602 and the capacitance of the supply line 608. When the internal leakage of the cells in the array 602 is relatively low and the capacitance of the supply line 608 is relatively large, the time required to test the retention mode can be long. In an embodiment of the invention, a discharge circuit 606 is added to the supply line 608 to draw current from the supply line 608. Drawing current from the supply line 608 through the discharge circuit 606 also lowers the voltage on the supply line 608. The current drawn through the discharge circuit 606 is proportional to the leakage current drawn by the cells in the array 602. By adding the discharge circuit 606 to drawn current from the supply line 608, the time required to test the retention mode can be shortened. Shortening test time reduces the cost of making an integrated circuit that contains an array of SRAM cells.

Figure 7A:
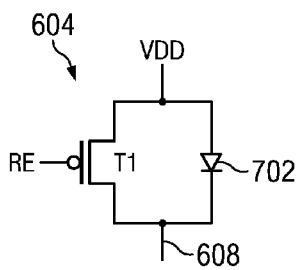
FIG. 7a is a schematic diagram of a retention circuit according to an embodiment of the invention. (Prior Art)

FIG. 7a shows an example of a retention circuit 604. In this embodiment, a PMOS (p-type metal-oxide semiconductor) transistor T1 is connected in parallel with a solid state diode 702 between VDD and the supply line 608. The source of the transistor T1 and the anode of the solid state diode 702 are electrically connected to VDD. The drain of the transistor T1 and the cathode of the solid state diode are electrically connected to the supply line 608. The gate of the transistor T1 is electrically connected to the control signal RE (retention enable). When the control signal RE is a logical low level (i.e. not in the retention mode), the transistor T1 is turned on and the solid state diode is shorted out. As a result, VDD is applied to the supply line 608. When the control signal RE is a logical high level (i.e. in the retention mode), the transistor T1 is turned off and current is conducted through the solid state diode 702. Because current is conducted through the solid state diode 702, a threshold voltage $V_t$ is dropped between VDD and the supply line 608. Because the supply line 608 is at voltage lower than VDD, less power is used.

Figure 7B:
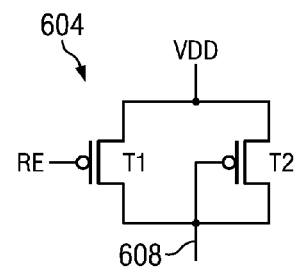
FIG. 7b is a schematic diagram of a retention circuit according to an embodiment of the invention. (Prior Art)

FIG. 7b shows an example of a retention circuit 604. In this embodiment, a PMOS transistor T1 is connected in parallel with PMOS transistor T2 (configured as a diode) between VDD and the supply line 608. The source of the transistor T1 and the anode of the transistor T2 are electrically connected to VDD. The drain of the transistor T1 and the cathode of transistor T2 are electrically connected to the supply line 608. The gate of the transistor T1 is electrically connected to the control signal RE. When the control signal RE is a logical low level (i.e. not in the retention mode), the transistor T1 is turned on and transistor T2 is shorted out. As a result, VDD is applied to the supply line 608. When the control signal RE is a logical high level (i.e. in the retention mode), the transistor T1 is turned off and current is conducted through transistor T2. Because current is conducted through transistor T2, a threshold voltage $V_t$ is dropped between VDD and the supply line 608. Because the supply line 608 is at voltage lower than VDD, less power is used.

Figure 7C:
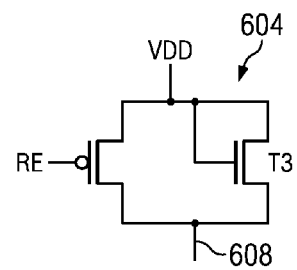
FIG. 7c is a schematic diagram of a retention circuit according to an embodiment of the invention. (Prior Art)

FIG. 7c shows an example of a retention circuit 604. In this embodiment, a PMOS transistor T1 is connected in parallel with NMOS (n-type metal-oxide semiconductor) transistor T3 (configured as a diode) between VDD and the supply line 608. The source of the transistor T1 and the anode of the transistor T3 are electrically connected to VDD. The drain of the transistor T1 and the cathode of transistor T3 are electrically connected to the supply line 608. The gate of the transistor T1 is electrically connected to the control signal RE (retention enable). When the control signal RE is a logical low level (i.e. not in the retention mode), the transistor T1 is turned on and transistor T3 is shorted out. As a result, VDD is applied to the supply line 608. When the control signal RE is a logical high level (i.e. in the retention mode), the transistor T1 is turned off and current is conducted through transistor T3. Because current is conducted through transistor T3, a threshold voltage $V_t$ is dropped between VDD and the supply line 608. Because the supply line 608 is at voltage lower than VDD, less power is used.

Figure 8A:
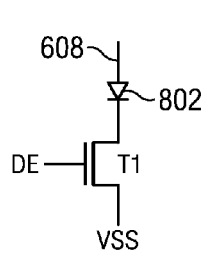
FIG. 8a is a schematic diagram of a discharge circuit according to an embodiment of the invention.

FIG. 8a shows an example of a discharge circuit 606. In this embodiment, an NMOS (n-type metal-oxide semiconductor) transistor T1 is connected in series with a solid state diode 802 between the supply line 608 and VSS. The anode of the diode 802 is connected to the supply line 608. The cathode of the diode 802 is connected to the drain of the transistor T1. The source of the transistor T1 is connected to VSS. The control signal DE (discharge enable) is connected to the gate of the transistor T1. When the control signal DE is a logical high value, the discharge circuit 606 is activated and current is drawn through the solid state diode 802 and the transistor T1. The solid state diode 802 is included to prevent the supply line 608 from being grounded when the discharge circuit 606 is activated. When the control signal DE is a logical low value, the discharge circuit 606 is inactivated and no current is drawn through the solid state diode 802 or the transistor T1.

Figure 8B:
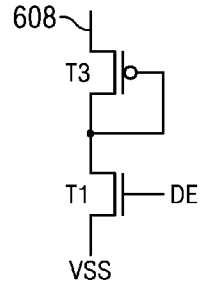
FIG. 8b is a schematic diagram of a discharge circuit according to an embodiment of the invention.

FIG. 8b shows an example of a discharge circuit 606. In this embodiment, an NMOS transistor T1 is connected in series with a diode-configured PMOS transistor T3 between the supply line 608 and VSS. The anode of the diode-configured PMOS transistor T3 is connected to the supply line 608. The cathode of the diode-configured PMOS transistor T3 is connected to the drain of transistor T1. The source of transistor T1 is connected to VSS. The control signal DE (discharge enable) is connected to the gate of the transistor T1. When the control signal DE is a logical high value, the discharge circuit 606 is activated and current is drawn through the diode-configured PMOS transistor T3 and the transistor T1. The diode-configured PMOS transistor T3 is included to prevent the supply line 608 from being grounded when the discharge circuit 606 is activated. When the control signal DE is a logical low value, the discharge circuit 606 is inactivated and no current is drawn through the diode-configured PMOS transistor T3 or the transistor T1.

Figure 8C:
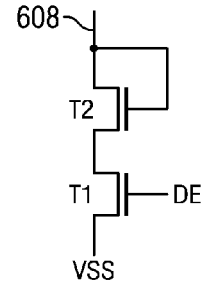
FIG. 8c is a schematic diagram of a discharge circuit according to an embodiment of the invention.

FIG. 8c shows an example of a discharge circuit 606. In this embodiment, an NMOS transistor T1 is connected in series with a diode-configured NMOS transistor T2 between the supply line 608 and VSS. The anode of the diode-configured NMOS transistor T2 is connected to the supply line 608. The cathode of the diode-configured NMOS transistor T2 is connected to the drain of transistor T1. The source of transistor T1 is connected to VSS. The control signal DE (discharge enable) is connected to the gate of the transistor T1. When the control signal DE is a logical high value, the discharge circuit 606 is activated and current is drawn through the diode-configured NMOS transistor T2 and the transistor T1. The diode-configured NMOS transistor T2 is included to prevent the supply line 608 from being grounded when the discharge circuit 606 is activated. When the control signal DE is a logical low value, the discharge circuit 606 is inactivated and no current is drawn through the diode-configured NMOS transistor T2 or the transistor T1.

In another embodiment of the invention, the voltage applied to the supply line 608 may be varied based on whether the array of SRAM cells 602 is in the retention mode or not. When the array of SRAM cells 602 is in the retention mode, the voltage applied to the supply line 608 is approximately equal to VDD minus a threshold voltage $V_t$. Lowering the voltage applied to the supply line 608 reduces the power drawn by the array of SRAM cells 602. When the array of SRAM cells 602 is not in the retention mode, the voltage applied to the sourcing supply line 608 is approximately equal to VDD.

The data stored in the array of SRAM cells 602 is expected to be correctly retained when ICs are manufactured under ideal conditions. However, process non-idealities such as defects and parametric variations cause data in some the cells in the array of SRAM cells 602 to be lost. Therefore, it is important to test the array of SRAM cells 602 to ensure that retention can be safely enabled. One method of testing the retention mode is to write a data pattern into the array of SRAM cells 602. After the data pattern is written into the array of SRAM cells 602, the array of SRAM cells 602 is put into the retention mode for a period of time. After this period of time has elapsed, the data pattern is read from the array of SRAM cells and compared to the data pattern written to the array of SRAM cells 602. When the data patterns match (i.e. no bit in the array has changed its logical value), retention mode testing is completed successfully. When the data patterns do not match (i.e. one or more bits in the array have changed logical values), the retention mode tested has failed and the SRAM cannot be safely used in retention mode.

The amount of time required to test the retention mode of an array of SRAM cells 602 increases as the leakage of cells decreases. The test time is dependent on the internal leakage of the cells in the array 602 and the capacitance of the supply line 608. When the internal leakage of the cells in the array 602 is relatively low and the capacitance of the supply line 608 is relatively large, the time required to test the retention mode can be long. In this embodiment of the invention, the internal leakage in the array of SRAM cells may be increased by forward biasing p/n junctions internal to the array of SRAM cells 602.

Figure 9:
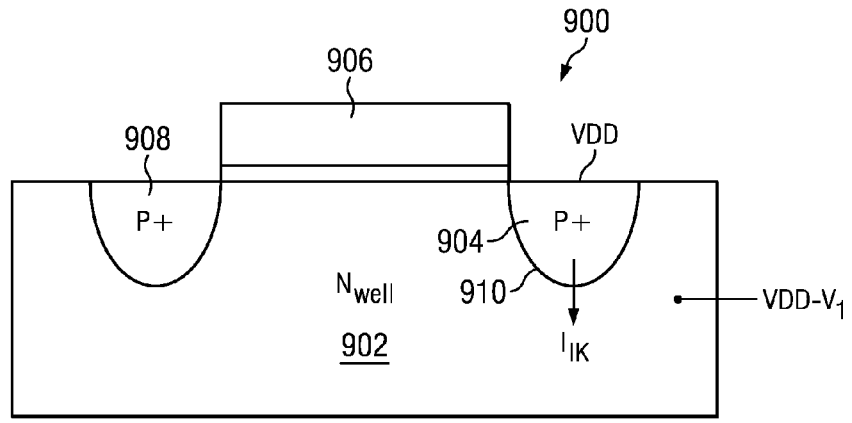
FIG. 9 is a cross-sectional view of an NWELL containing a PMOS transistor wherein a P/N junction is forward-biased according to an embodiment of the invention.

FIG. 9 is a cross-sectional view of an NWELL containing a PMOS transistor 900 wherein a P/N junction 910 is forward-biased according to an embodiment of the invention. In this embodiment, the source 904 of the PMOS transistor has voltage of VDD and the Nwell 902 has a voltage of VDD-$V_1$. As an example, when the voltage $V_1$ is 0.1 volts, the p/n junction 910 between the p-type source 904 and the n-type Nwell 902 is forward-biased because the voltage on the p-type source 904 is higher than the voltage on the n-type Nwell 902. Because the p/n junction is forward-biased leakage current $I_{lk}$ is conducted between the source 904 and the Nwell 902. Increasing the leakage current also causes the voltage on the supply line 608 to decrease. By increasing the leakage in this manner, the time required to test the retention mode of the array of SRAM cells may be shortened. Shortening test time reduces the cost of making an integrated circuit that contains an array of SRAM cells.

During normal operation of the array of SRAM cells 602, the Nwell 904 voltage is increased to VDD reducing the leakage current $I_{lk}$.

Figure 10:
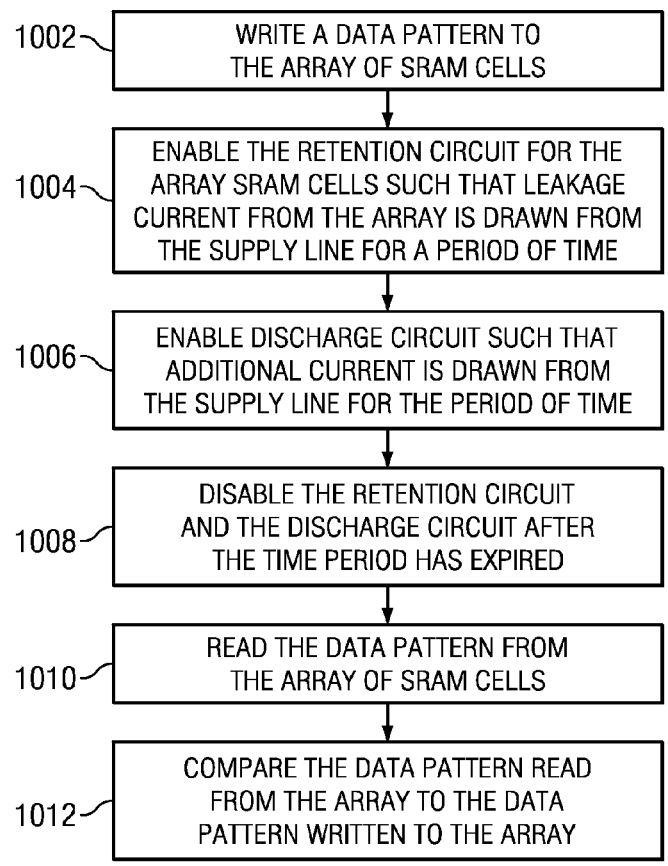
FIG. 10 is a flow chart illustrating a method of testing the retention mode of an array of SRAM cells according to an embodiment of the invention.

FIG. 10 is a flow chart illustrating a method of testing the retention time of an array of SRAM cells according to an embodiment of the invention. During step 1002 a data pattern is written to the array of SRAM cells 602. After writing the data pattern into the array of SRAM cells 602, each cell contains a known logical value. During step 1004 the retention mode for the array of SRAM cells 602 is enabled for a period of time. During the retention mode, the voltage on the supply line 608 is lowered to approximately VDD-$V_t$. When the array of SRAM cells 602 is in the retention mode, leakage current from the SRAM cells in the array 602 draws current from the supply line 608. Also during this period of time, a discharge circuit 606 is enabled as shown in step 1006. When the discharge circuit 606 is enabled, additional current is drawn from the supply line 608 through the discharge circuit 606. Drawing additional current from the supply line 608 through the discharge circuit 606 reduces the time required to test the retention mode.

After the period to time has expired, the retention circuit and the discharge circuit are disabled as shown in step 1008.

After the retention circuit and the discharge circuit are disabled, the data pattern is read from the array of SRAM cells as shown in step 1010. During step 1012, the data pattern read from the array of SRAM cells 602 is compared to the data pattern written to the array of SRAM cells 602. When the data patterns match (i.e. no bit in the array has changed its logical value), the retention mode testing has completed successfully. When the data patterns do not match (i.e. one or more bits in the array have changed logical values), the retention mode tested has failed and the array of SRAM cells 602 cannot be safely used in retention mode.

Figure 11:
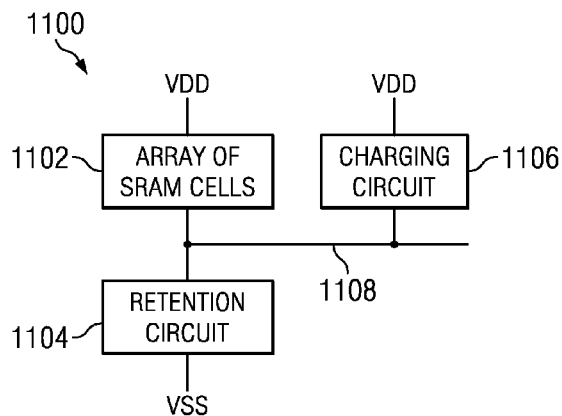
FIG. 11 is a block diagram of an array of SRAM cells, a retention circuit and a charging circuit according to an embodiment of the invention.

FIG. 11 is a block diagram of an array of SRAM cells 1102, a retention circuit 1104 and a charging circuit 1106 according to an embodiment of the invention. In this embodiment of the invention, the voltage applied to the supply line 1108 may be varied based on whether the array of SRAM cells 1102 is in the retention mode or not. When the array of SRAM cells 1102 is in the retention mode, the voltage applied to the supply line 1108 is approximately equal to a threshold voltage $V_t$. Increasing the voltage applied to the supply line 1108 reduces the power drawn by the array of SRAM cells 1102. When the array of SRAM cells 1102 is not in the retention mode, the voltage applied to the sourcing supply line 1108 is approximately equal to VSS.

The data stored in the array of SRAM cells 1102 is expected to be correctly retained when ICs are manufactured under ideal conditions. However, process non-idealities such as defects and parametric variations cause data in some the cells in the array of SRAM cells 1102 to be lost. Therefore, it is important to test the array of SRAM cells 1102 to ensure that retention can be safely enabled. One method of testing the retention mode is to write a data pattern into the array of SRAM cells 1102. After the data pattern is written into the array of SRAM cells 1102, the array of SRAM cells 1102 is put into the retention mode for a period of time. After this period of time has elapsed, the data pattern is read from the array of SRAM cells 1102 and compared to the data pattern written to the array of SRAM cells 1102. When the data patterns match (i.e. no bit in the array has changed its logical value), retention mode testing is completed successfully. When the data patterns do not match (i.e. one or more bits in the array have changed logical values), the retention mode tested has failed and the SRAM cannot be safely used in retention mode.

The amount of time required to test the retention mode of an array of SRAM cells 1102 increases as the leakage of cells decreases. The test time is dependent on the internal leakage of the cells in the array 1102 and the capacitance of the supply line 1108. When the internal leakage of the cells in the array 1102 is relatively low and the capacitance of the supply line 1108 is relatively large, the time required to test the retention mode can be long. In an embodiment of the invention, a charging circuit 1106 is added to the supply line 1108 to supply current to the supply line 1108. The current supplied by the charging circuit 1106 is proportional to the leakage current drawn by the cells in the array 1102. Supplying current to the supply line 1108 through the charging circuit 1106 also raises the voltage on the supply line 1108. By adding the charging circuit 1106 to supply current to the supply line 1108, the time required to test the retention mode can be shortened. Shortening test time reduces the cost of making an integrated circuit that contains an array of SRAM cells.

Figure 12A:
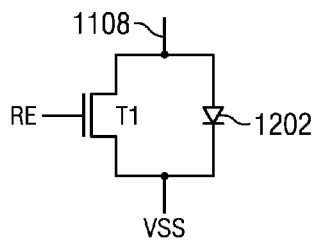
FIG. 12a is a schematic diagram of a retention circuit according to an embodiment of the invention. (Prior Art)

FIG. 12a shows an example of a retention circuit 1104. In this embodiment, an NMOS (n-type metal-oxide semiconductor) transistor T1 is connected in parallel with a solid state diode 1202 between the supply line 1108 and VSS. The drain of the transistor T1 and the anode of the solid state diode 1202 are electrically connected to the supply line 1108. The source of the transistor T1 and the cathode of the solid state diode 120 are electrically connected to VSS. The gate of the transistor T1 is electrically connected to the control signal RE (retention enable). When the control signal RE is a logical high level (i.e. not in the retention mode), the transistor T1 is turned on and the solid state diode is shorted out. As a result, VSS is applied to the supply line 1108. When the control signal RE is a logical low level (i.e. in the retention mode), the transistor T1 is turned off and current is conducted through the solid state diode 1202. Because current is conducted through the solid state diode 1202, a threshold voltage $V_t$ is dropped between VDD the supply line 1108 and VSS. Because the supply line 1108 is at a voltage higher than Vss, less power is used.

Figure 12B:
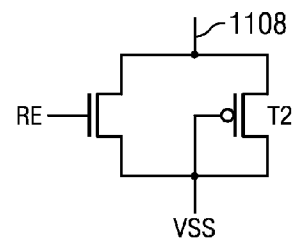
FIG. 12b is a schematic diagram of a retention circuit according to an embodiment of the invention. (Prior Art)

FIG. 12b shows an example of a retention circuit 1104. In this embodiment, an NMOS transistor T1 is connected in parallel with PMOS transistor T2 (configured as a diode) between the supply line 1108 and VSS. The drain of the transistor T1 and the anode of the transistor T2 are electrically connected to the supply line 1108. The source of the transistor T1 and the cathode of transistor T2 are electrically connected to VSS. The gate of the transistor T1 is electrically connected to the control signal RE. When the control signal RE is a logical high level (i.e. not in the retention mode), the transistor T1 is turned on and transistor T2 is shorted out. As a result, VSS is applied to the supply line 1108. When the control signal RE is a logical low level (i.e. in the retention mode), the transistor T1 is turned off and current is conducted through transistor T2. Because current is conducted through transistor T2, a threshold voltage $V_t$ is dropped between the supply line 1108 and VSS. Because the supply line 1108 is at a voltage higher than VSS, less power is used.

Figure 12C:
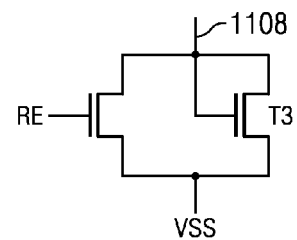
FIG. 12c is a schematic diagram of a retention circuit according to an embodiment of the invention. (Prior Art)

FIG. 12c shows an example of a retention circuit 1104. In this embodiment, an NMOS transistor T1 is connected in parallel with NMOS (n-type metal-oxide semiconductor) transistor T3 (configured as a diode) between the supply line 1108 and VSS. The drain of the transistor T1 and the anode of the transistor T3 are electrically connected to the supply line 1108. The source of the transistor T1 and the cathode of transistor T3 are electrically connected to VSS. The gate of the transistor T1 is electrically connected to the control signal RE (retention enable). When the control signal RE is a logical high level (i.e. not in the retention mode), the transistor T1 is turned on and transistor T3 is shorted out. As a result, VSS is applied to the supply line 1108. When the control signal RE is a logical low level (i.e. in the retention mode), the transistor T1 is turned off and current is conducted through transistor T3. Because current is conducted through transistor T3, a threshold voltage $V_t$ is dropped between the supply line 1108 and VSS. Because the supply line 1108 is at a voltage higher than VSS, less power is used.

Figure 13A:
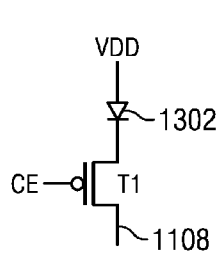
FIG. 13a is a schematic diagram of a charging circuit according to an embodiment of the invention.

FIG. 13a shows an example of a charging circuit 1106. In this embodiment, a PMOS transistor T1 is connected in series with a solid state diode 1302 between VDD and the supply line 1108. The anode of the solid state diode 1302 is connected to VDD. The cathode of the solid state diode 1302 is connected to the drain of the transistor T1. The source of the transistor T1 is connected to supply line 1108. The control signal CE (charge enable) is connected to the gate of the transistor T1. When the control signal CE is a logical low value, the charging circuit 1106 is activated and current is drawn through the solid state diode 1302 and the transistor T1. The solid state diode 1302 is included to prevent the supply line 1108 from being directly connected to VDD when the charging circuit 1106 is activated. When the control signal CE is a logical high value, the charging circuit 1106 is inactivated and no current is drawn through the solid state diode 1302 or the transistor T1.

Figure 13B:
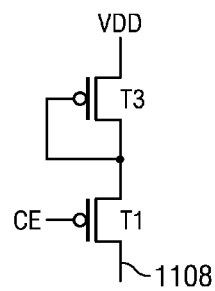
FIG. 13b is a schematic diagram of a charging circuit according to an embodiment of the invention.

FIG. 13b shows an example of a charging circuit 1106. In this embodiment, an PMOS transistor T1 is connected in series with a diode-configured PMOS transistor T3 between VDD and the supply line 1108. The anode of the diode-configured PMOS transistor T3 is connected to VDD. The cathode of the diode-configured PMOS transistor T3 is connected to the drain of transistor T1. The source of transistor T1 is connected to the supply line 1108. The control signal CE is connected to the gate of the transistor T1. When the control signal CE is a logical low value, the charging circuit 1106 is activated and current is drawn through the diode-configured PMOS transistor T3 and the transistor T1. The diode-configured PMOS transistor T3 is included to prevent the supply line 608 from being directly connected to VDD when the charging circuit 1106 is activated. When the control signal CE is a logical high value, the charging circuit 1106 is inactivated and no current is drawn through the diode-configured PMOS transistor T3 or the transistor T1.

Figure 13C:
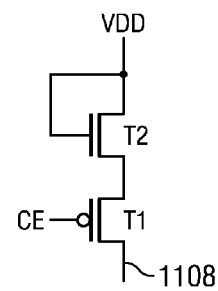
FIG. 13c is a schematic diagram of a charging circuit according to an embodiment of the invention.

FIG. 13c shows an example of a charging circuit 1106. In this embodiment, an NMOS transistor T1 is connected in series with a diode-configured NMOS transistor T2 between VDD and the supply line 1108. The anode of the diode-configured NMOS transistor T2 is connected to VDD. The cathode of the diode-configured NMOS transistor T2 is connected to the drain of transistor T1. The source of transistor T1 is connected to the supply line 1108. The control signal CE is connected to the gate of the transistor T1. When the control signal CE is a logical low value, the charging circuit 1106 is activated and current is drawn through the diode-configured NMOS transistor T2 and the transistor T1. The diode-configured NMOS transistor T2 is included to prevent the supply line 608 from being directly connected to VDD when the discharge circuit 606 is activated. When the control signal CE is a logical high value, the discharge circuit 1106 is inactivated and no current is drawn through the diode-configured NMOS transistor T2 or the transistor T1.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of testing a retention mode of an array of static random access memory (SRAM) cells, comprising:
   writing a data pattern to the array of SRAM cells, wherein each SRAM cell in the array of SRAM cells has a known value written thereto as a result of writing the data pattern;
   at the start of a period of time following the writing of the data pattern to the array of SRAM cells, enabling a retention mode and a discharge mode for the array of SRAM cells;

wherein enabling of the retention mode includes biasing a plurality of transistors in the array of SRAM cells to increase the leakage current from sources internal to the array of SRAM cells so that the array of SRAM cells draws a first current from a supply line coupled to the array of SRAM cells during the period of time, the first current being based on the increased leakage current;

wherein enabling of the discharge mode includes drawing a second current, external to the array of SRAM cells, from the supply line during the period of time using a discharge circuit separate from the array of SRAM cells; and wherein, as a result of drawing the first and second currents from the supply line during the period of time, a voltage of the supply line is decreased from a first voltage to a second voltage at the end of the period of time, the first voltage being the voltage of the supply line from prior to the start of the period of time;

after the period of time has expired, disabling the retention mode and the discharge mode, wherein the voltage of the supply line is restored to the first voltage as a result of disabling the retention mode and the discharge mode;

reading the data pattern from the array of SRAM cells after the period of time has expired; and comparing the data pattern read from the array of SRAM cells to the data pattern written to the array of SRAM cells to determine whether the testing of the retention mode was successful.

2. The method of claim 1, wherein the discharge circuit comprises a solid state device and an NMOS (n-type metal-oxide semiconductor) transistor, the solid state device having a cathode and anode, wherein the anode of the solid state device is connected to the supply line and the cathode of the solid state device is connected to the drain of the NMOS transistor; the NMOS transistor having a gate, a drain and a source, wherein the source of the NMOS transistor is connected to VSS of the array of SRAM cells and the gate of the first transistor is connected to a first control signal, wherein the first control signal is driven to a logical high value when enabling the discharge mode, wherein the first control signal is driven to a logic low when the discharge mode is disabled, and wherein the second current is drawn through the discharge circuit.

3. The method of claim 2, wherein the solid state device is selected from a group of solid state devices consisting of a diode, an NMOS (n-type metal-oxide semiconductor) transistor configured as a diode, and a PMOS (p-type metal-oxide semiconductor) transistor configured as a diode.

4. The method of claim 1, wherein a voltage is applied to the supply line through a solid state device and a PMOS (p-type metal-oxide semiconductor) transistor, the solid state device having a cathode and anode and the PMOS transistor having a gate, a drain and a source, wherein the anode of the solid state device and the source of the PMOS transistor are connected to VDD of the array of SRAM cells, wherein the cathode of the solid state device and the drain of the PMOS transistor are connected to the supply line, wherein the gate of the PMOS transistor is connected to a second control signal, wherein the second control signal is driven to a logical high value when enabling the retention mode, and wherein the second control signal is driven to a logic low value when the retention mode is disabled.

5. The method of claim 4, wherein the solid state device is selected from a group of solid state devices consisting of a diode, an NMOS (n-type metal-oxide semiconductor) transistor configured as a diode and a PMOS (p-type metal-oxide semiconductor) transistor configured as a diode.

6. The method of claim 1, wherein biasing the plurality of transistors in the array of SRAM cells to increase the leakage current from sources internal to the array of SRAM cells comprises forward-biasing P/N junctions of the plurality of transistors.

7. The method of claim 6, wherein forward-biasing the P/N junctions of the plurality of transistors comprises reducing a voltage on all NWELL regions corresponding to the plurality of transistors.

8. A circuit for testing a retention mode of an array of Static Random Access Memory (SRAM) cells comprising:

a retention circuit, the retention circuit electrically connected between VDD of the array of SRAM cells and a supply line of the array of SRAM cells; and a discharge circuit separate from the array of SRAM cells, the discharge circuit electrically connected between the supply line of the array of SRAM cells and VSS of the array of SRAM cells;

wherein the array of SRAM cells are arranged in rows and columns, each row of the SRAM cells connected to a word line and each column of the SRAM cells connected to a pair of bit lines;

wherein each memory cell in the array of SRAM cells is connected to the supply line of the array of SRAM cells and VSS of the array of SRAM cells;

wherein after a data pattern is written to the array of SRAM cells, each SRAM cell in the array of SRAM cells stores a known value, and the retention circuit supplies a first current to the supply line;

wherein during a period of time beginning after the writing of the data pattern, the retention mode is enabled and, in response thereto, a plurality of transistors of the array of SRAM cells is biased to increase a leakage current from sources internal to the array of SRAM cells so that the array of SRAM cells draws a second current from the supply line the second current being based on the increased leakage current;

wherein during the period of time, a discharge mode is enabled and, in response thereto, the discharge circuit draws a third current, external to the array of SRAM cells, from the supply line during the period of time;

wherein, as a result of drawing the second and third currents, the voltage on the supply line is decreased from a first voltage to a second voltage at the end of the period of time, the first voltage being the voltage of the supply line from prior to the start of the period of time;

wherein, after the period of time has expired, the retention mode and discharge mode are disabled and, in response thereto, the retention circuit and the discharge circuit are disabled, wherein the voltage on the supply line returns to the first voltage as a result of disabling the retention circuit and the discharge circuit;

wherein the array of SRAM cells is read to retrieve the data pattern stored in the array of SRAM cells after the period of time has expired; and wherein the data pattern read from the array of SRAM cells is compared to the data pattern written to the array of SRAM cells to determine whether the testing of the retention mode was successful.

9. The circuit of claim 8, wherein the discharge circuit comprises:

a solid state device, the solid state device having a cathode and anode, wherein the anode of the solid state device is connected to the supply line; and an NMOS (n-type metal-oxide semiconductor) transistor having a gate, drain and source, wherein the cathode of the solid state device is connected to the drain of the NMOS transistor; the source of the NMOS transistor is connected to VSS of the array of SRAM cells and the gate of the NMOS transistor is connected to a first control signal, wherein the first control signal is driven to a logical high value when enabling the discharge mode and wherein the first control signal is driven to a logic low when the discharge mode is disabled.

10. The circuit of claim 8, wherein the retention circuit comprises:
  a solid state device, the solid state device having a cathode and anode, wherein the anode of the solid state device is connected to VDD of the array of SRAM cells; and
  an PMOS (p-type metal-oxide semiconductor) transistor having a gate, drain and source, wherein the source of the PMOS transistor is connected to VDD, wherein the cathode of the solid state device and the drain of the PMOS device are connected to the supply line, and the gate of the PMOS transistor is connected to a second control signal, wherein retention circuit is enabled when the second control signal is a logical high level, wherein retention circuit is disabled when the second control signal is a logical low level.

11. The circuit of claim 8, wherein biasing the plurality of transistors in the array of SRAM cells to increase the leakage current from sources internal to the array of SRAM cells comprises forward-biasing P/N junctions of the plurality of transistors.

12. The circuit of claim 11, wherein forward-biasing the P/N junctions of the plurality of transistors comprises reducing a voltage on all NWELL regions corresponding to the plurality of transistors.

* * * * *